United States Patent
Nasu et al.

(10) Patent No.: US 10,531,557 B2
(45) Date of Patent: Jan. 7, 2020

(54) WIRELESS MODULE, RFID SYSTEM, AND WIRELESS POWER SUPPLY DEVICE

(71) Applicant: Murata Manufacturing Co., Ltd., Kyoto-fu (JP)

(72) Inventors: Takafumi Nasu, Nagaokakyo (JP); Tatsuya Hosotani, Nagaokakyo (JP); Katsumi Taniguchi, Nagaokakyo (JP); Makoto Takeoka, Nagaokakyo (JP); Masaaki Kanao, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/183,471

(22) Filed: Nov. 7, 2018

(65) Prior Publication Data

US 2019/0075648 A1  Mar. 7, 2019

Related U.S. Application Data

(63) Continuation of application No. PCT/JP2017/025702, filed on Jul. 14, 2017.

(30) Foreign Application Priority Data

Jul. 28, 2016 (JP) ................ 2016-148895

(51) Int. Cl.
*G06K 19/06* (2006.01)
*H05K 1/02* (2006.01)
(Continued)

(52) U.S. Cl.
CPC ....... *H05K 1/0216* (2013.01); *G06K 7/10366* (2013.01); *G06K 19/07773* (2013.01);
(Continued)

(58) Field of Classification Search
USPC ................... 235/487, 492; 340/572.1–572.9
See application file for complete search history.

(56) References Cited

U.S. PATENT DOCUMENTS 7,070,095 B1 * 7/2006 Gandel ................ G06K 19/041
235/380
2009/0284377 A1 * 11/2009 Tuttle ............... G06K 19/07749
340/572.7

FOREIGN PATENT DOCUMENTS

JP    H05-83173 A    4/1993
JP    2015-167395 A    9/2015
(Continued)

OTHER PUBLICATIONS

International Search Report issued in PCT/JP2017/025702; dated Sep. 19, 2017.
(Continued)

*Primary Examiner* — Jamara A Franklin
(74) *Attorney, Agent, or Firm* — Studebaker & Brackett PC (57) ABSTRACT

A wireless module includes a substrate that includes a first portion, a second portion, and a first flexible portion connecting the first portion and the second portion to each other. The first portion includes a circuit element that is mounted on the first main surface and a circuit including at least the circuit element. The second portion includes a first coil connected to the circuit. The first portion and the second portion face each other. A magnetic sheet is disposed on a second main surface of the second portion, and a battery is disposed between the second main surface of the first portion and the magnetic layer.

20 Claims, 10 Drawing Sheets

(51) Int. Cl.
    *H01F 38/14*     (2006.01)
    *H02J 50/10*     (2016.01)
    *H04B 1/3883*     (2015.01)
    *H04B 1/525*     (2015.01)
    *H04B 5/00*     (2006.01)
    *H04B 5/02*     (2006.01)
    *H05K 3/46*     (2006.01)
    *H04B 1/3827*     (2015.01)
    *H01Q 1/52*     (2006.01)
    *H01Q 7/00*     (2006.01)
    *G06K 7/10*     (2006.01)
    *G06K 19/077*     (2006.01)
    *H05K 1/18*     (2006.01)
    *H05K 1/16*     (2006.01)
    *H02J 7/02*     (2016.01)

(52) U.S. Cl.
CPC ............... *H01F 38/14* (2013.01); *H01Q 1/52* (2013.01); *H01Q 7/00* (2013.01); *H02J 50/10* (2016.02); *H04B 1/3827* (2013.01); *H04B 1/3883* (2013.01); *H04B 1/525* (2013.01); *H04B 5/0031* (2013.01); *H04B 5/0037* (2013.01); *H04B 5/0062* (2013.01); *H04B 5/0081* (2013.01); *H04B 5/02* (2013.01); *H05K 1/028* (2013.01); *H05K 1/189* (2013.01); *H05K 3/4691* (2013.01); *H02J 7/025* (2013.01); *H05K 1/165* (2013.01); *H05K 2201/055* (2013.01); *H05K 2201/056* (2013.01); *H05K 2201/083* (2013.01); *H05K 2201/086* (2013.01); *H05K 2201/1003* (2013.01); *H05K 2201/10037* (2013.01); *H05K 2201/10098* (2013.01)

(56) References Cited

FOREIGN PATENT DOCUMENTS

| | | |
|---|---|---|
| JP | 2016-021692 A | 2/2016 |
| JP | 2016-051961 A | 4/2016 |
| WO | 2012/036139 A1 | 3/2012 |

OTHER PUBLICATIONS

Written Opinion issued in PCT/JP2017/025702; dated Sep. 19, 2017.

\* cited by examiner

WIRELESS MODULE, RFID SYSTEM, AND WIRELESS POWER SUPPLY DEVICE

CROSS-REFERENCE TO RELATED APPLICATIONS

This application claims benefit of priority to International Patent Application No. PCT/JP2017/025702, filed Jul. 14, 2017, and to Japanese Patent Application No. 2016-148895, filed Jul. 28, 2016, the entire contents of each are incorporated herein by reference.

BACKGROUND

Technical Field

The present disclosure relates to a wireless module used for, for example, wireless communication or wireless power supply, and a RFID system and a wireless power supply device that include the wireless module.

Background Art

An existing RFID system includes a RFID tag in which a printed circuit board that includes an antenna coil and a communication circuit and a power supply battery are contained in a housing. In particular, Japanese Unexamined Patent Application Publication No. 5-83173 discloses that a printed circuit board on which a battery is mounted is disposed on the back side of an antenna coil to inhibit the antenna coil from being affected by a metallic object located near the antenna coil.

SUMMARY

The RFID tag disclosed in Japanese Unexamined Patent Application Publication No. 5-83173 carries a risk that a circuit included in the printed circuit board interferes with the antenna coil in the RFID tag or a destination antenna coil because the battery is located on the opposite side of the printed circuit board from the antenna coil. In the case where the distance between the antenna coil and the printed circuit board is increased to inhibit this problem, the thickness of a device increases.

Accordingly, the present disclosure provides a wireless module that has a decreases thickness and that enables a circuit included in a substrate to be inhibited from interfering with a coil, and a RFID system and a wireless power supply device that include the wireless module.

A wireless module according to the present disclosure includes a substrate that has a first main surface and a second main surface. The substrate includes a first portion, a second portion, and a first flexible portion connecting the first portion and the second portion to each other. The first portion has part of the first main surface and part of the second main surface, and the second portion has part of the first main surface and part of second main surface. The wireless module further includes a circuit element that is mounted on the first main surface or second main surface at the first portion, and a coil that is connected to a circuit including at least the circuit element. The substrate is folded along the first flexible portion such that the first main surface is on an outside and the second main surface is on an inside, and the first portion and the second portion face each other. A magnetic layer is disposed on the second main surface at the second portion, and a battery is disposed between the second main surface at the first portion and the magnetic layer. With this structure, the circuit including the circuit element is shielded by the battery, and the battery is shielded by a magnetic sheet from magnetic flux that interlinks the coil.

A wireless module according to the present disclosure includes a substrate that has a first main surface and a second main surface. The substrate includes a first portion, a second portion, and a first flexible portion connecting the first portion and the second portion to each other. The first portion has part of the first main surface and part of the second main surface, and the second portion has part of the first main surface and part of the second main surface. The wireless module further includes a circuit element that is mounted on the first main surface or the second main surface at the first portion, and a coil that is connected to a circuit including at least the circuit element. The substrate is folded along the first flexible portion such that the first main surface is on an outside and the second main surface is on an inside, and the first portion and the second portion face each other. A dielectric layer is disposed on the second main surface at the second portion, and a battery is disposed between the second main surface of the first portion and the dielectric layer. With this structure, the dielectric layer ensures uniform distribution of an electric field that is generated by a magnetic field generated by an electric current flowing through the coil and inhibits an unnecessary electric field or magnetic field from being radiated.

A pattern that is located nearest to the second main surface at the second portion among patterns that form the coil is preferably formed on the second main surface at the second portion or in a layer near the second main surface at the second portion. In this case, the coil and the magnetic sheet are adjacent to each other, the inductance of the coil that is conducive to communication increases, and a coefficient of coupling with a destination coil increases.

The substrate preferably has a multilayer body of insulating layers, and the number of the insulating layers at the first portion and the second portion is preferably larger than that at the first flexible portion. This makes it easy to form the substrate such that the first portion and the second portion that are rigid and the first flexible portion that is flexible are integrally formed.

The substrate preferably further includes a third portion and a second flexible portion connecting the third portion to the first portion or the second portion. A battery-holding portion that holds the battery is preferably disposed at the third portion. The substrate is preferably folded along the second flexible portion such that the third portion is interposed between the first portion and the second portion. This decreases the number of components and facilitates assembly.

The substrate preferably has a multilayer body of insulating layers. The number of the insulating layers at the third portion is preferably larger than that at the first flexible portion and the second flexible portion. This inhibits a region of the third portion on which the battery is mounted from deforming and makes the battery unlikely to be separated.

For example, the battery-holding portion is disposed on the first main surface at the third portion and the second main surface at the third portion. This enables two batteries to be stacked, and the wireless module has a necessary power source.

The substrate preferably further includes a fourth portion and a third flexible portion connecting the fourth portion to the first portion, the second portion, or the third portion. The substrate is preferably folded along the third flexible portion such that the fourth portion is located on an opposite side of the first portion from the second portion. The coil is preferably disposed also at the fourth portion. This enables both of the first portion and the fourth portion to be used for wireless power supply or communication with the coil and improves convenience.

The substrate preferably further includes a fourth portion and a third flexible portion connecting the fourth portion to the first portion, the second portion, or the third portion. The substrate is preferably folded along the third flexible portion such that the fourth portion is located on an opposite side of the first portion from the second portion. The coil is preferably disposed also at the fourth portion. This enables both of the first portion and the fourth portion to be used for wireless power supply or communication with the coil and improves convenience.

For example, the circuit element includes a communication antenna or a communication module that includes the communication antenna, and a communication circuit that uses the communication module or the communication antenna as the first portion is formed. This achieves another communication other than wireless power supply and communication with the coil.

It is preferable that the communication antenna does not overlap the battery when viewed in a direction in which the first portion and the second portion are stacked. In this case, the communication antenna can communicate without being shielded by the battery.

The wireless module preferably further includes a housing that includes a principal part composed of an insulator and that accommodates a multilayer structure that includes the first portion, the second portion, and the battery. This simplifies a structure for accommodating the multilayer body in the housing, enables the wireless module to be small, and enables the wireless module to have a high environmental resistance.

A RFID system according to the present disclosure includes any of the wireless modules described above, and a wireless tag that includes a coil coupled with the coil of the wireless module and that wirelessly communicates with the wireless module. The circuit including the circuit element includes a tag-reading circuit. This structure enables the system to read the wireless tag with the wireless module that is small.

A wireless power supply device according to the present disclosure includes any of the wireless modules described above, and a power transmitter that includes a coil coupled with the coil of the wireless module and that wirelessly supplies power to the wireless module. The circuit including the circuit element includes a power reception circuit. This structure enables the wireless module of the system to wirelessly receive power from the power transmitter.

For example, the power reception circuit includes a rectifier-smoothing circuit that includes a rectifier element and a capacitor and that rectifies and smooths an induced voltage of the coil. Also, the battery can be a secondary battery that is charged by an output of the rectifier-smoothing circuit. In addition, the battery can be an electric double layer capacitor that is charged by an output of the rectifier-smoothing circuit. Furthermore, the battery can be a polymer electrolytic capacitor that is charged by an output of the rectifier-smoothing circuit.

The present disclosure provides a wireless module that has a decreases thickness and that enables a circuit included in a substrate to be inhibited from interfering with a coil, and a RFID system and a wireless power supply device that include the wireless module.

DETAILED DESCRIPTION

Specific examples will hereinafter be provided with reference to the drawings to describe embodiments for carrying out the present disclosure. In the drawings, like components are designated by like reference numbers. In consideration for description of main points and understandability, the embodiments are separately described for convenience. However, features described in different embodiments can be partially replaced or combined. In embodiments beyond a second embodiment, description of common matters to those in a first embodiment is omitted, and only different matters will be described. In particular, the same effects achieved by the same structure are not described in all of the embodiments.

A "coil" described according to the embodiments can be used on both sides of transmission (power transmission) and reception (power reception) of a signal (or power). The "coil" is not limited to a source of magnetic flux even in the case where the coil is described as an antenna that radiates the magnetic flux. The coil can be used when receiving magnetic flux that an opponent coil radiates (interlinkage), that is, when the relationship of transmission and reception is opposite.

The "coil" described according to the embodiments below is a coil used for close-range communication that uses magnetic field coupling with a destination coil or a coil used for close-range wireless power supply that uses magnetic field coupling with an opponent coil for wireless power supply. In the case of communication, the coil is used for a communication system such as a NFC (Near field communication) system. In the case of wireless power supply, the coil is used for a wireless power supply device in, for example, an electromagnetic induction method or a magnetic resonance method. That is, the "coil" described according to the embodiments is used at least in communication that uses magnetic field coupling or a wireless transmission system for, for example, wireless power supply. The "coil" described according to the embodiments is used, for example, in a HF band, in particular, at 13.56 MHz or 6.78 MHz, or in a frequency band near the frequencies.

The size of the coil (typically, the length of a coil conductor of the coil from an end to the other end along the coil conductor) is sufficiently smaller than a wave length $\lambda$ at a frequency that is used. The radiation efficiency of an electromagnetic wave is low in a frequency band that is used. More specifically, the length of a current path of the coil is less than $\lambda/10$. When the length is sufficiently shorter than the wave length in the frequency band that is used, the distribution of electric current that flows through the coil conductor scarcely fluctuates with respect to a coordinate axis along the coil conductor, and an almost constant current flows. The wave length described herein means an effective wave length in consideration for dielectric properties of a base on which the coil conductor is formed and reduction in the wave length due to magnetic permeability.

When the "coil" is used for close-range communication, a power supply circuit that operates a signal (power) in the above frequency band that is used is connected to both ends of the coil conductor of the coil. The coil conductor of the coil and the power supply circuit may be connected to each other by magnetic field coupling via a power supply coil or a transformer (including a balun). In this case, both ends of a coil conductor of the power supply coil or the transformer are connected to the power supply circuit, and both ends of the coil conductor of the coil are connected to each other directly or via a capacitor. When the "coil" is used for wireless power supply, a power reception circuit is connected to both ends of the coil conductor of the coil.

First Embodiment

Figure 1:
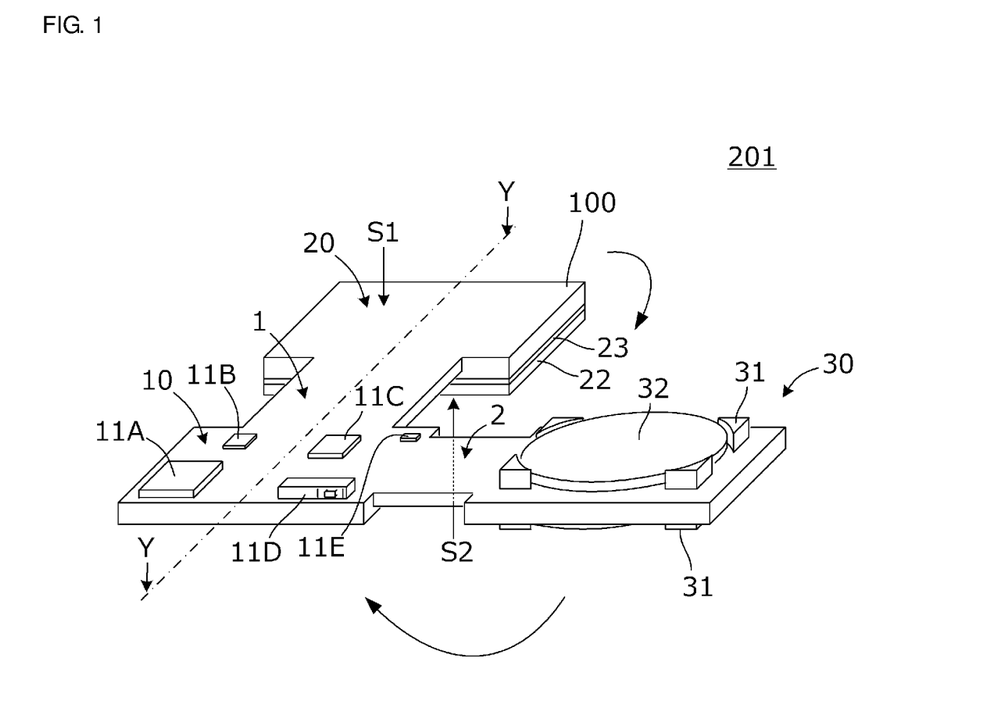
FIG. 1 is a perspective view of a wireless module that includes a substrate according to a first embodiment with the substrate unfolded.
Figure 2:
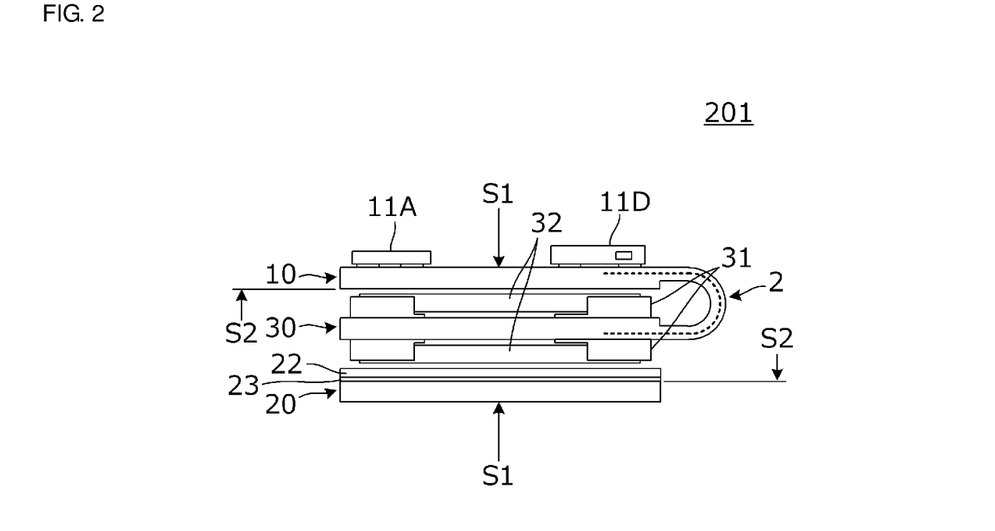
FIG. 2 is a front view of the wireless module.

FIG. 1 is a perspective view of a wireless module 201 that includes a substrate according to a first embodiment with the substrate unfolded. FIG. 2 is a front view of the wireless module 201.

The wireless module 201 includes a substrate 100. The substrate 100 has a first main surface S1 and a second main surface S2. The substrate 100 includes a first portion 10, a second portion 20, a third portion 30, a first flexible portion 1 connecting the first portion 10 and the second portion 20 to each other, and a second flexible portion 2 connecting the first portion 10 and the third portion 30 to each other.

Circuit elements 11A, 11B, 11C, 11D, and 11E, for example, are mounted on the part of the first main surface S1 of the first portion 10. A first coil is formed on the part of the second main surface S2 of the second portion 20 and in a layer near the second main surface S2. The first coil, the structure of which will be described later is connected to a circuit that includes, for example, the circuit elements 11A, 11B, 11C, 11D, and 11E. A magnetic sheet 22 composed of, for example, magnetic ferrite adheres to the second main surface S2 of the second portion 20 with an adhesive layer 23 interposed therebetween.

Batteries 32 are held by battery-holding portions 31, which are disposed on the part of the first main surface S1 and the part of the second main surface S2 at the third portion 30. An example of the batteries 32 is a lithium battery in the form of a coin such as CR2032. A combination of two batteries 32 that are connected in series can be used as a power supply for a circuit of a power supply voltage of about 3 V. The third portion 30 thus configured enables plural batteries to be readily mounted thereon because both surfaces of the third portion 30 can be used as mounting surfaces.

As illustrated in FIG. 2, the substrate 100 is folded along the first flexible portion 1 such that the first main surface S1 is on the outside and the second main surface S2 is on the inside. The first portion 10 and the second portion 20 face each other. The substrate 100 is folded along the second flexible portion 2 such that the first main surface S1 is on the outside and the second main surface S2 is on the inside. The third portion 30 is interposed between the first portion 10 and the second portion 20. Accordingly, the batteries 32 are disposed between the second main surface S2 of the first portion 10 and the magnetic sheet 22.

Figure 3A:
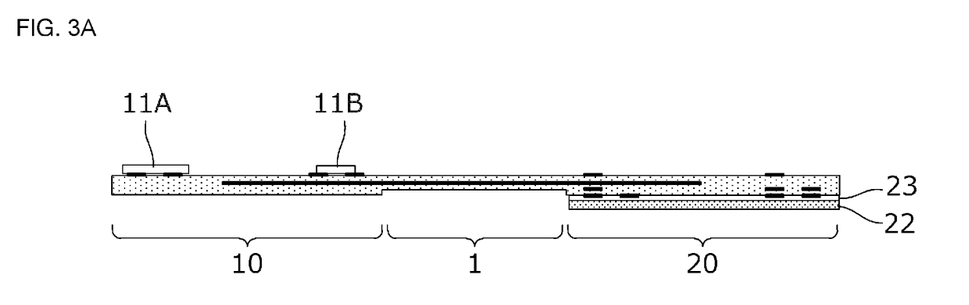
FIG. 3A is a sectional view of a portion along line Y-Y in FIG. 1.
Figure 3B:
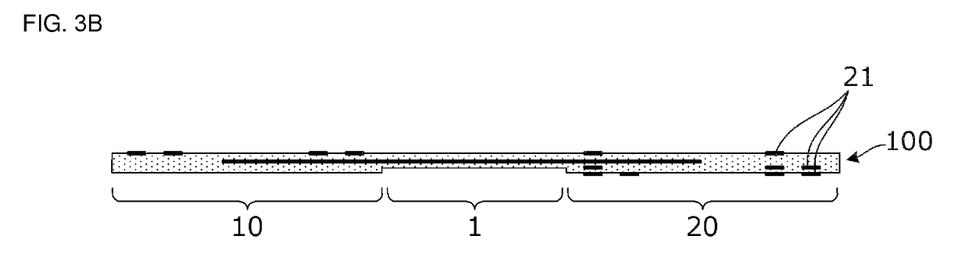
FIG. 3B is a sectional view of the substrate at the portion.
Figure 3C:
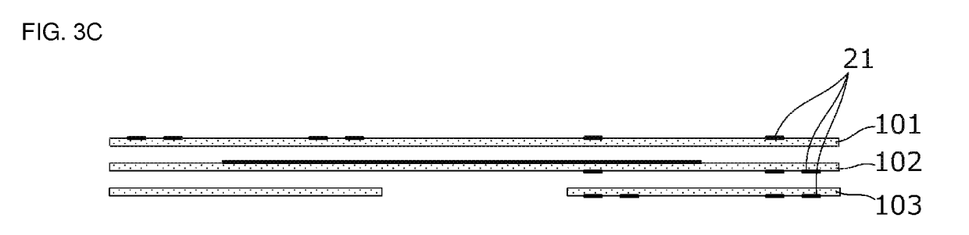
FIG. 3C is an exploded sectional view of a substrate.

FIG. 3A is a sectional view of a portion along line Y-Y in FIG. 1. FIG. 3B is a sectional view of the substrate at the portion. FIG. 3C is an exploded sectional view of the substrate 100. The substrate 100 includes insulating layers 101, 102, and 103 that are composed of a thermoplastic resin such as a liquid-crystal polymer (LCP). The first portion 10, the second portion 20, and the third portion 30 each have a multilayer body of the insulating layers 101, 102, and 103. The first flexible portion 1 and the second flexible portion 2 each have a multilayer body of the insulating layers 101 and 102. That is, the number of the insulating layers at the first portion 10, the second portion 20, and the third portion 30 is larger than that at the first flexible portion 1 and the second flexible portion 2. Consequently, the substrate is formed such that the first portion 10, the second portion 20, and the third portion 30 that are rigid and the first flexible portion and the second flexible portion that are flexible are integrally formed.

According to the present embodiment, there are steps at connections between the rigid portions and the flexible portions of the substrate 100. These steps are located on the inside of the substrate 100 folded. For example, as illustrated in FIG. 2, the step at the connection between the first portion 10 and the second flexible portion 2 of the substrate and the step at the connection between the third portion 30 and the second flexible portion 2 are located on the inside of the second flexible portion 2 folded. This structure makes the insulating layers unlikely to be separated because no tensile stress is applied to the steps.

Figure 4:
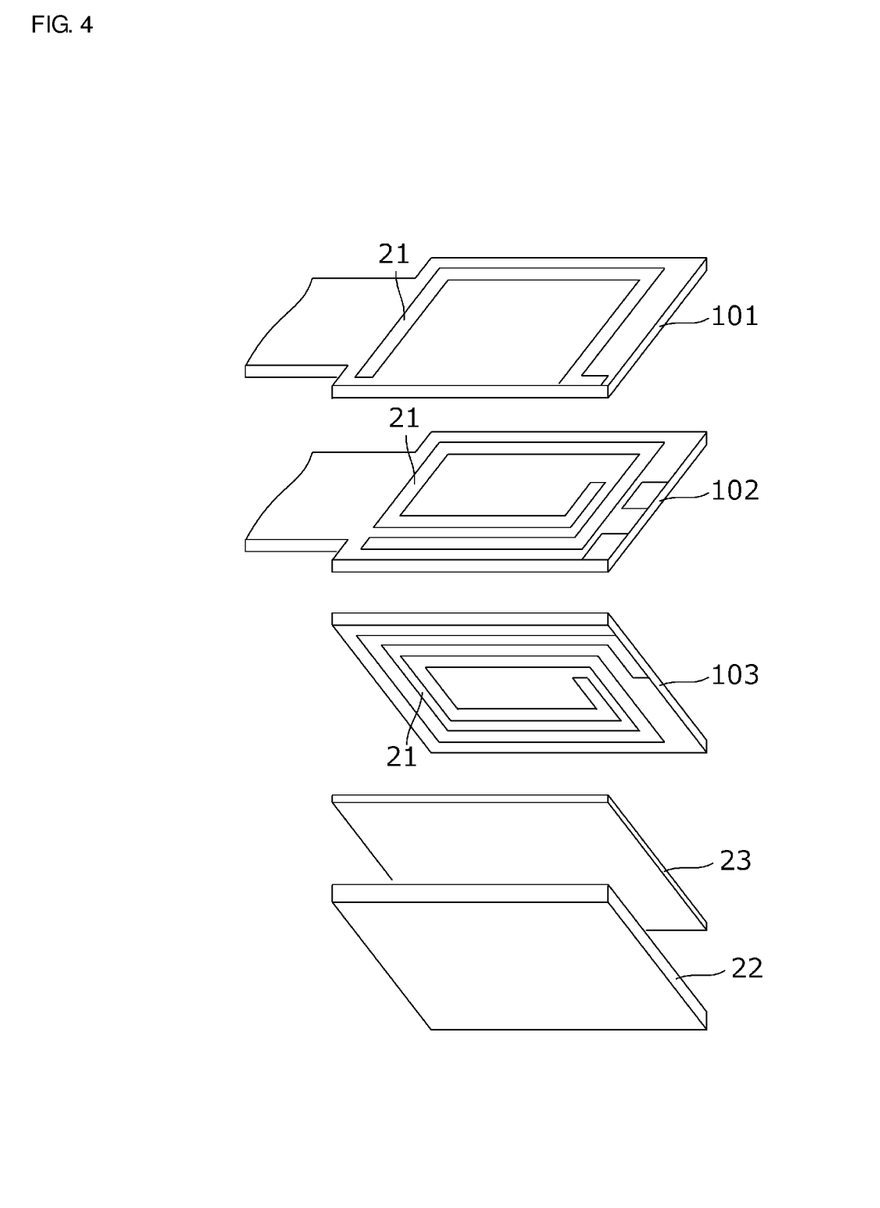
FIG. 4 is an exploded perspective view of the structure of a portion at which a first coil is formed.

FIG. 4 is an exploded perspective view of the structure of a portion at which the first coil is formed. A first coil 21 is formed in plural turns across three layers of the upper surface (the first main surface S1 of the substrate 100) of the insulating layer 101, the upper surface of the insulating layer 102, and the lower surface of the insulating layer 103. Both ends of the first coil are connected to the circuit that is formed at the first portion 10 via the first flexible portion 1. A conductor pattern that forms the first coil 21 is formed, for example, by patterning a Cu foil. A surface of the conductor pattern that forms the first coil 21 is exposed to the outside, and this surface may be coated with a resist film.

Figure 5:
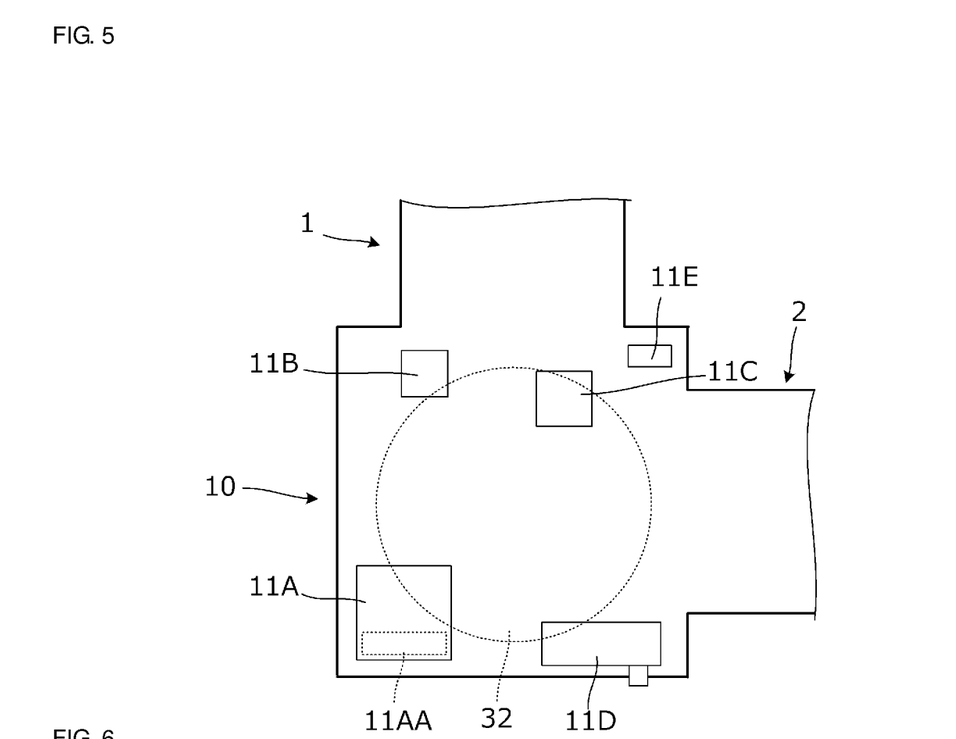
FIG. 5 is a plan view of a first portion of the substrate.

FIG. 5 is a plan view of the first portion 10 of the substrate 100. An example of the circuit element 11A is a communication control IC of Bluetooth (registered trademark) that uses a radio wave in a band of 2.4 GHz (ISM band), particularly, for BLE (Bluetooth (registered trademark) Low Energy) communication. The circuit element 11B is a NFC control IC. The circuit element 11C is a memory such as EEPROM. The circuit element 11E is a LED. The circuit element 11D is a power switch.

The circuit element 11A, which is a communication control IC, contains a BLE communication antenna 11AA in a band of 2.4 GHz. The most part of the communication antenna 11AA (the entire part illustrated in FIG. 5 by way of example) does not overlap the batteries 32 in a plan view. With this structure, the communication antenna 11AA can communicate without being covered by the batteries 32.

Figure 6:
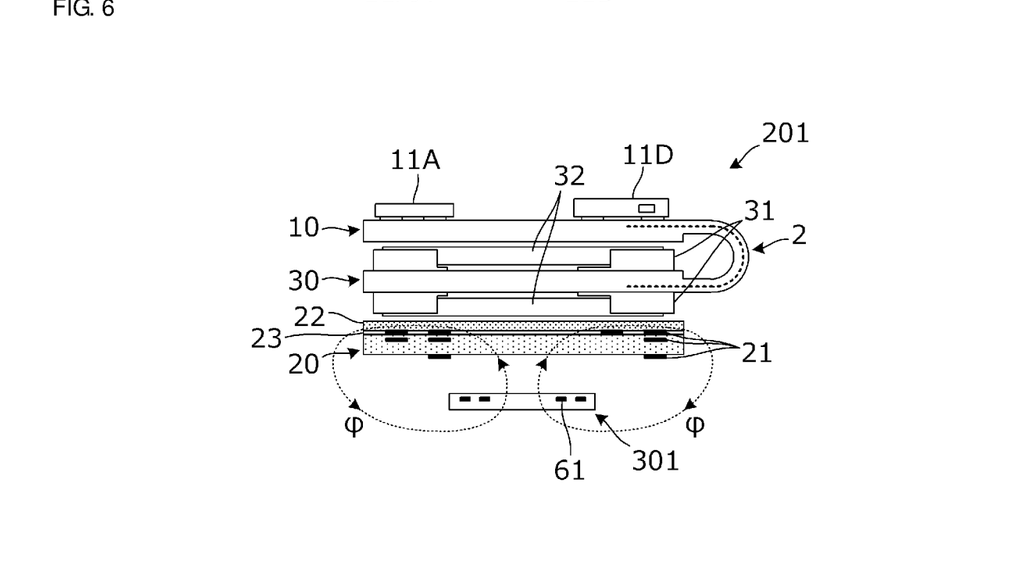
FIG. 6 illustrates the wireless module according to the embodiment coupled with a RF tag, which is a destination.

FIG. 6 illustrates the wireless module 201 according to the embodiment coupled with the RF tag 301, which is a destination. The RF tag 301 is illustrated in a sectional view. The second portion 20 of the substrate of the wireless module 201 is also illustrated in the sectional view. The RF tag 301 is located on the opposite side of the second portion 20 of the wireless module 201 from the first portion 10. The RF tag 301 is an example of a "wireless tag" according to the present disclosure.

Each battery 32 includes a metal exterior body and serves as a shield plate. In the wireless module 201, the batteries 32 are inserted between the circuit that includes, for example, the circuit elements 11A and 11D and the first coil 21. Accordingly, the batteries 32 shield the circuit from, for example, the first coil 21 and inhibits the circuit and the first coil from mutually interfering with each other.

The circuit elements 11A and 11D, for example, are disposed on the first main surface of the first portion 10. This makes it easy to provide a space in which the batteries 32 are disposed and enables the distance between the first coil 21 and the circuit elements 11A and 11D or other components to be increased. Accordingly, the mutual interference is effectively inhibited.

Magnetic flux φ interlinks the first coil 21 of the wireless module 201 and a coil 61 of the RF tag 301, and the first coil 21 and the coil 61 are coupled with each other by magnetic field coupling. The magnetic flux φ is likely to pass through the magnetic sheet 22. Accordingly, the magnetic sheet 22 serves as a magnetic path, an eddy current is unlikely to be generated in the batteries 32, and the batteries 32 scarcely impede the magnetic flux that interlinks the first coil 21.

In an example illustrated in FIG. 6, the wireless module 201 communicates with the RF tag 301. In the case where the wireless module 201 is a device that wirelessly receives power, a coil of a power transmitter is adjacent to the first coil 21. Also, in this case, the circuit is shielded by the batteries 32 and inhibited from interfering with the coil of the power transmitter. The magnetic sheet 22 serves as the magnetic path. Moreover, a magnetic field from the coil of the power transmitter is shielded by the magnetic sheet 22, and accordingly, an eddy current is unlikely to flow to the batteries 32. Consequently, the batteries are inhibited from generating heat. In addition, the batteries 32 scarcely impede the magnetic flux that interlinks the first coil 21.

In the above example, the magnetic sheet 22 is provided. However, a dielectric layer such as a dielectric sheet may be provided instead of the magnetic sheet 22. The dielectric layer ensures uniform distribution of an electric field that is generated by a magnetic field generated by an electric current flowing through the first coil 21 and inhibits an unnecessary electric field or magnetic field from being radiated. An aluminum plate or an aluminum sheet may be used as the dielectric sheet.

In the case where the wireless module 201 is a device that receives power by wireless power supply, each battery 32 may be, for example, a secondary battery that is charged by the output of a rectifier-smoothing circuit. The battery 32 may be an electric double layer capacitor or a polymer electrolytic capacitor. The induced voltage of the first coil 21 is rectified and smoothed by the rectifier-smoothing circuit that includes a rectifier element and a capacitor. The first coil 21 and the rectifier-smoothing circuit form a power reception circuit. The power reception circuit supplies power to the batteries 32.

Figure 7A:
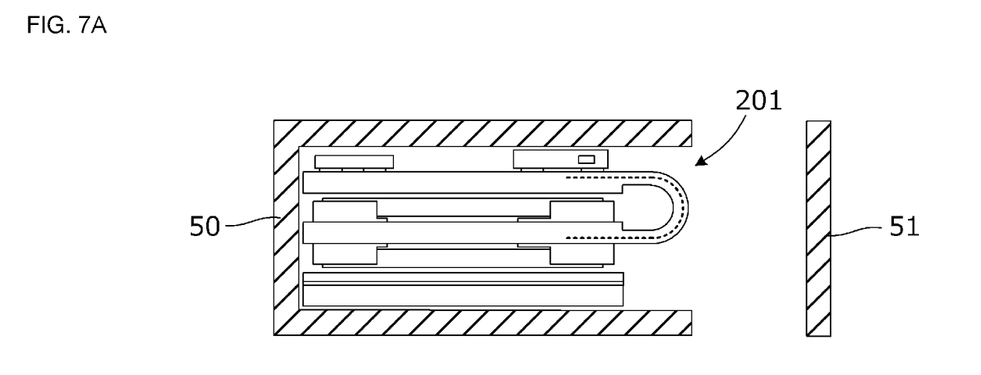
FIG. 7A and FIG. 7B illustrate an example of the wireless module that includes a housing.
Figure 7B:
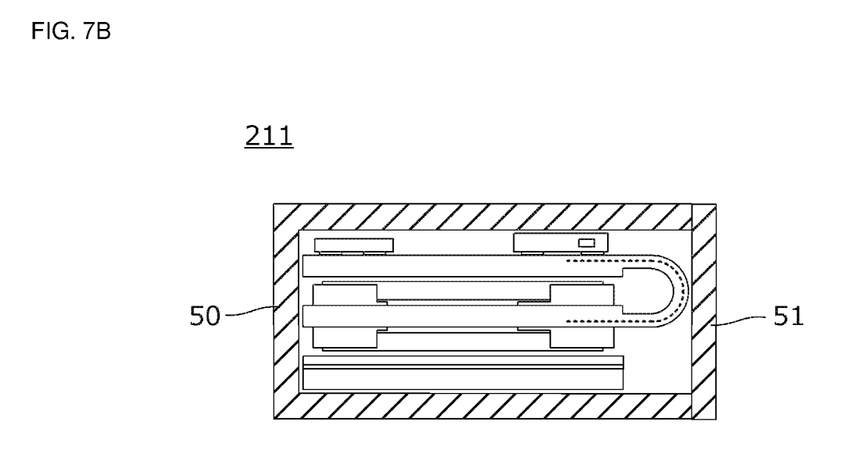

FIG. 7A and FIG. 7B illustrate an example of the wireless module that includes a housing. FIG. 7A and FIG. 7B illustrate sections of a housing 50 and a lid 51. In this example, the wireless module 201 illustrated in FIG. 2 is accommodated in the housing 50. The housing 50 and the lid 51 each have an insulating, non-magnetic resin molded body. As illustrated in FIG. 7B, the lid 51 is put on the housing 50 and secured, for example, with a screw, and this enables a wireless module 211 to have airtightness and waterproof properties. The housing 50 may have an opening in a large area surface of the surfaces of the housing, and the wireless module 201 may be accommodated in the housing 50.

Second Embodiment

A second embodiment differs from the first embodiment in having a different relationship of connections among the first portion 10, the second portion 20, and the third portion 30 with the flexible portions interposed therebetween.

Figure 8:
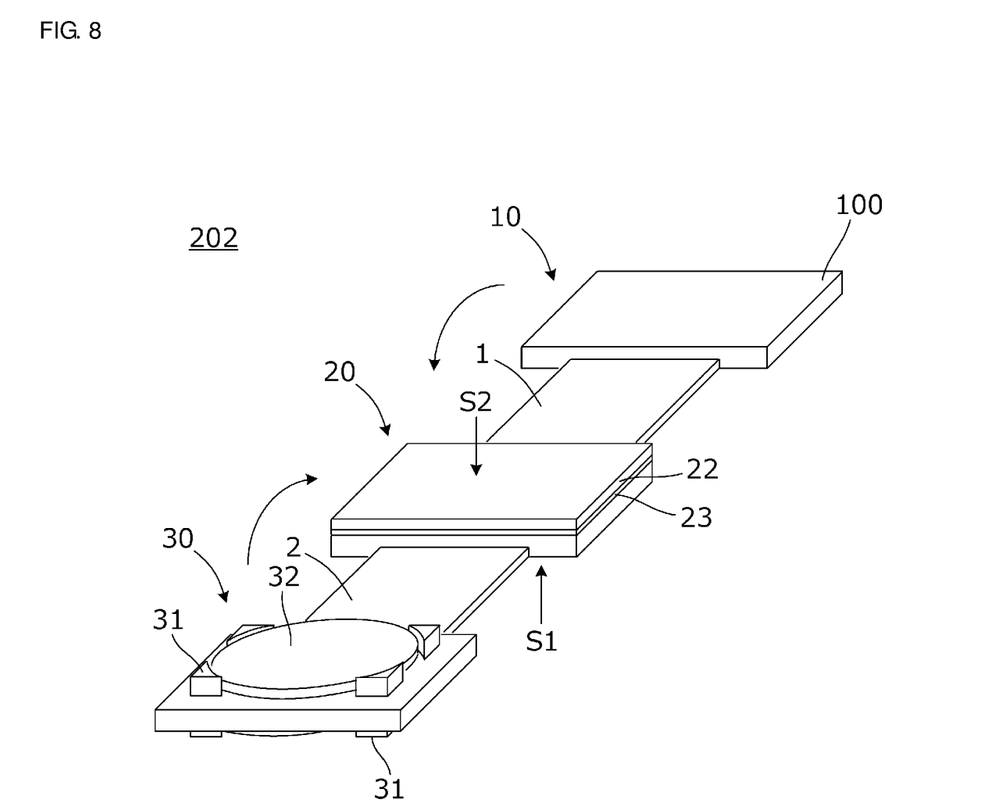
FIG. 8 is a perspective view of a wireless module that includes a substrate according to a second embodiment with the substrate unfolded.
Figure 9:
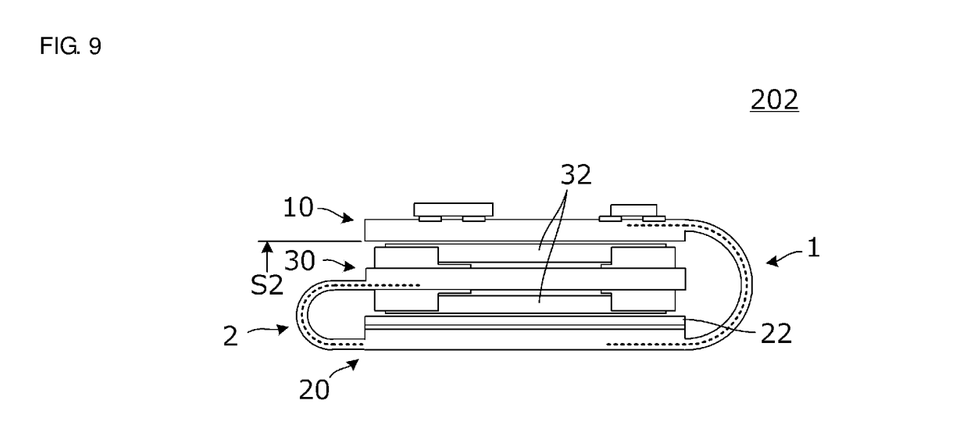
FIG. 9 is a front view of the wireless module.

FIG. 8 is a perspective view of a wireless module 202 that includes a substrate according to the second embodiment with the substrate unfolded. FIG. 9 is a front view of the wireless module 202.

The wireless module 202 includes the substrate 100. The substrate 100 has the first main surface S1 and the second main surface S2. The substrate 100 includes the first portion 10, the second portion 20, the third portion 30, the first flexible portion 1 connecting the first portion 10 and the second portion 20 to each other, and the second flexible portion 2 connecting the second portion 20 and the third portion 30 to each other.

Circuit elements are mounted on the first main surface S1 of the first portion 10. The first coil is formed at the second portion 20. The magnetic sheet 22 adheres to the second main surface S2 of the second portion 20 with the adhesive layer 23 interposed therebetween. The batteries 32 are held by the battery-holding portions 31, which are disposed on the first main surface S1 and the second main surface S2 at the third portion 30.

As illustrated in FIG. 9, the substrate 100 is folded along the first flexible portion 1 and the second flexible portion 2 such that the first main surface S1 is on the outside and the second main surface S2 is on the inside. The third portion 30 is interposed between the first portion 10 and the second portion 20. Accordingly, the batteries 32 are located between the second main surface S2 of the first portion 10 and the magnetic sheet 22.

The structures of the first portion 10, the second portion 20, and the third portion 30 are the same as described according to the first embodiment. There are many relationships of connections among the first portion 10, the second portion 20, and the third portion 30 with the flexible portions interposed therebetween other than those in the first and second embodiments. The relationship of connections may be determined in consideration for the relationship of the position at which the circuit that is formed at the first portion 10 and the first coil are connected to each other and in consideration for easiness of insertion into the housing.

Third Embodiment

According to a third embodiment, a wireless module further includes a second coil.

Figure 10:
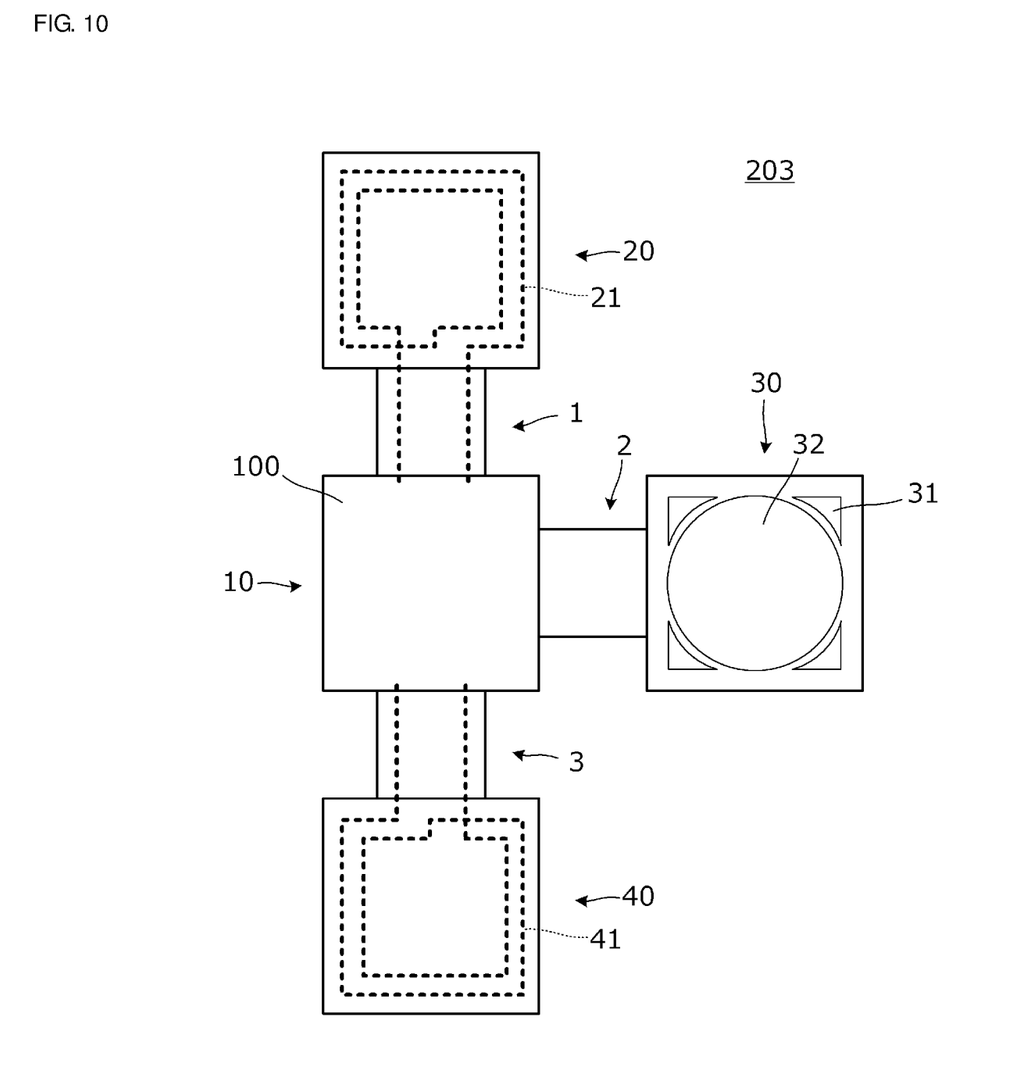
FIG. 10 is a plan view of a wireless module that includes a substrate according to a third embodiment with the substrate unfolded.
Figure 11:
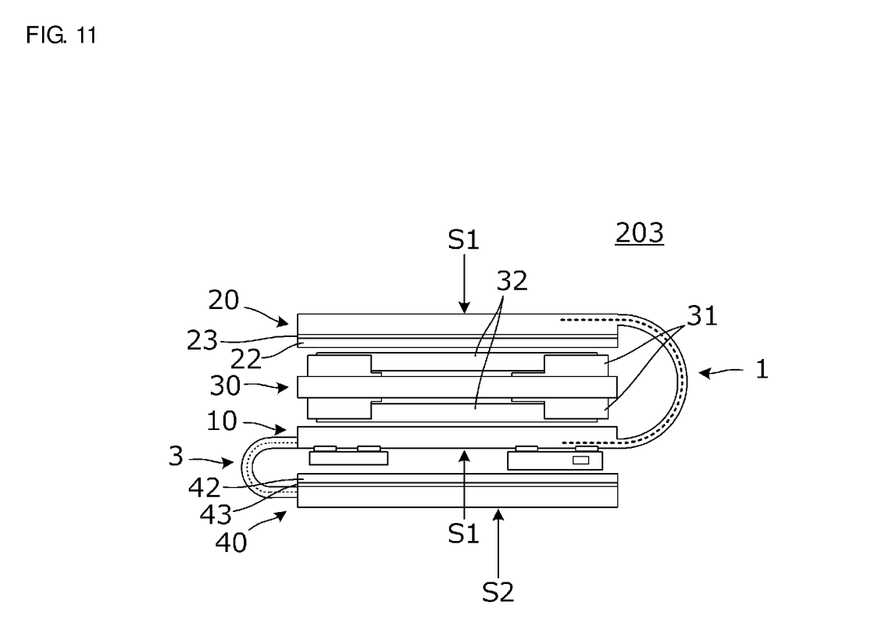
FIG. 11 is a front view of the wireless module.

FIG. 10 is a plan view of a wireless module 203 that includes a substrate according to the third embodiment with the substrate unfolded. FIG. 11 is a front view of the wireless module 203.

The wireless module 203 includes the substrate 100. The substrate 100 has the first main surface S1 and the second main surface S2. The substrate 100 includes the first portion 10, the second portion 20, the third portion 30, a fourth portion 40, the first flexible portion 1 connecting the first portion 10 and the second portion 20 to each other, and the second flexible portion 2 connecting the first portion 10 and the third portion 30 to each other, and a third flexible portion 3 connecting the first portion 10 and the fourth portion 40 to each other.

Circuit elements are mounted on the first main surface S1 of the first portion 10. The first coil 21 is formed at the second portion 20. A second coil 41 is formed at the fourth portion 40. The first coil 21 and the second coil 41 are connected to the above circuit. The magnetic sheet 22 adheres to the second main surface S2 of the second portion 20 with the adhesive layer 23 interposed therebetween. A magnetic sheet 42 adheres to the first main surface of the fourth portion 40 with an adhesive layer 43 interposed therebetween. The batteries 32 are held by the battery-holding portions 31, which are disposed on the first main surface S1 and the second main surface S2 at the third portion 30.

The first coil 21 and the second coil 41 are connected in series or in parallel and serve as the coils. Accordingly, communication can be achieved with the same sensitivity in both cases where the first main surface S1 of the second portion 20 illustrated in FIG. 11 faces a destination and the second main surface S2 of the fourth portion 40 faces the destination.

Fourth Embodiment

According to a fourth embodiment, an example of a RFID system will be described.

Figure 12:
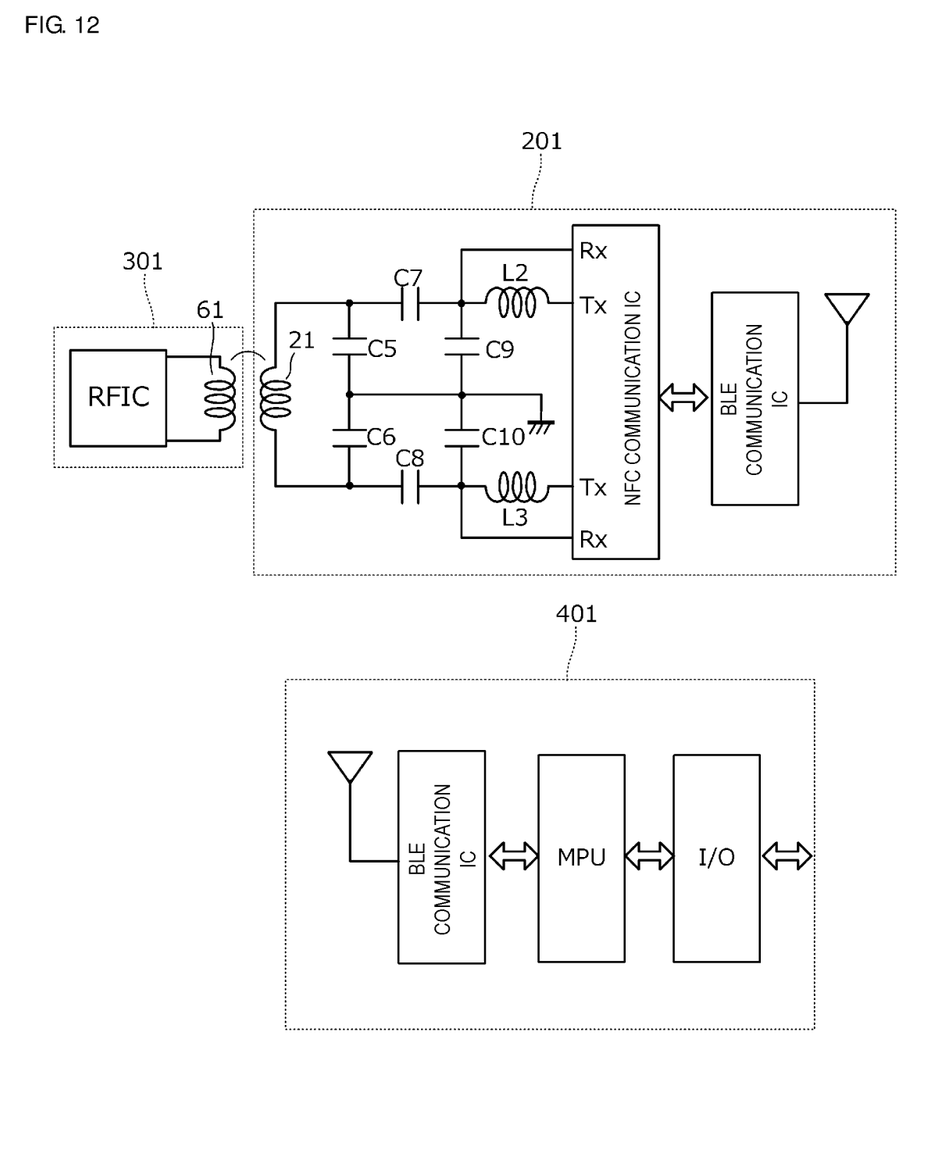
FIG. 12 is a block diagram of a RFID system that includes the wireless module, the RF tag, and a host device.

FIG. 12 is a block diagram of a RFID system that includes the wireless module 201, the RF tag 301, and a host device 401. The wireless module 201 is the same wireless module as described according to the above embodiment. A circuit diagram is illustrated therein. A matching circuit that includes capacitors C5, C6, C7, C8, C9, and C10 and inductors L2 and L3, and a NFC communication IC are connected to the first coil 21 with a filter interposed therebetween. The NFC communication IC communicates with the RF tag 301 to read tag information. A BLE communication IC receives the tag information from the NFC communication IC for BLE communication. The host device 401 includes a BLE communication IC, a microprocessor MPU, and an I/O port. The BLE communication IC of the host device 401 communicates with the BLE communication IC of the wireless module 201 to obtain the tag information. The batteries 32 are used as power supply voltage of the NFC communication IC and the BLE communication IC. The host device 401 of the RFID system can readily obtain the tag information of the RF tag 301 merely by bringing the wireless module 201 that is small close to the RF tag 301.

Fifth Embodiment

According to a fifth embodiment, an example of a wireless power supply device will be described.

Figure 13:
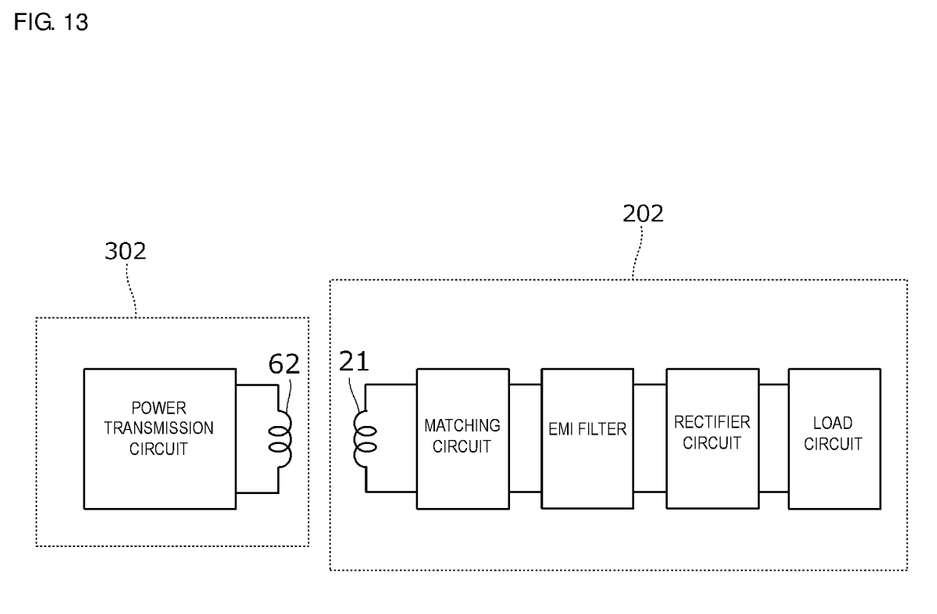
FIG. 13 is a block diagram of a wireless power supply device that wirelessly supplies power.

FIG. 13 is a block diagram of a wireless power supply device that wirelessly supplies power. The wireless power supply device includes a power transmitter 302 and the wireless module 202. The wireless module 202 is the same wireless module as described according to the above embodiment. A power transmission circuit of the power transmitter 302 applies an alternating voltage of, for example, 6.78 MHz to a coil 62. A voltage that is induced by the first coil 21 of the wireless module 202 is transferred into direct-current power through a matching circuit, an EMI filter, and a rectifier circuit. A load circuit uses the power as a power source. The load circuit includes secondary batteries (the batteries 32 described according to the embodiments). The secondary batteries are charged. The wireless power supply device may further include a smoothing circuit or a DC-DC converter circuit at a subsequent stage of the rectifier circuit.

A wireless power supply method can be, for example, a magnetic resonance method other than the electromagnetic induction method.

Other Embodiments

According to the above embodiments, the magnetic sheet 22 adheres to the second main surface of the second portion 20 of the substrate. However, the magnetic sheet 22 may adhere to the battery 32 that faces the second portion 20. The magnetic sheet 22 may be merely interposed between the battery 32 that faces the second portion 20 and the second portion 20. A magnetic layer may be formed by applying a magnetic material instead of the magnetic sheet 22. For example, a liquid-state magnetic material may be applied to the second main surface of the second portion 20 of the substrate and subsequently solidified.

According to the above embodiments, the circuit elements are mounted on the first main surface S1 of the first portion 10 of the substrate. The circuit elements may be formed on the second main surface S2 of the first portion 10 or may be mounted on both of the first main surface S1 and the second main surface S2.

According to the above embodiments, the coil of the wireless module is used for either communication or power reception. The coil may double as a coil for communication and power reception. For example, the batteries can be charged by disposing the wireless module 211 illustrated in FIG. 7B on a charging stand of the power transmitter 302 illustrated in FIG. 13, and the tag information can be sent to the host device by bringing the wireless module 211 close to the RF tag 301 as illustrated in FIG. 6.

In an example illustrated in FIG. 12, the wireless module 201 reads the tag information of the RF tag. The same structure can be used in the case where the wireless module is provided with a sensor such as an acceleration sensor or an illuminance sensor, and a detection value or a detection amount is wirelessly sent to the outside by, for example, BLE communication.

According to the above embodiments, the batteries are disposed on both of the first main surface S1 and the second main surface S2 at the third portion of the substrate. However, the batteries may be disposed on one of the surfaces.

According to the above embodiments, the substrate includes the third portion for mounting the batteries. However, the batteries may be interposed between the first portion 10 and the second portion 20 of the substrate.

According to the above embodiments, the battery-holding portions are disposed at the third portion of the substrate. However, the batteries may be directly connected to the third portion.

According to the above embodiments, the wireless module is used alone. However, the wireless module may be incorporated with an electronic device.

Lastly, the above embodiments are described by way of example and are not restrictive. Modifications and alterations can be appropriately made by a person skilled in the art. The range of the present disclosure is not shown by the above embodiments but is shown by the scope of claims. The present disclosure includes modifications to the embodiments within the scope of the claims and equivalents of the claims.

What is claimed is:

1. A wireless module comprising:
   a substrate that has a first main surface and a second main surface, and the substrate includes a first portion, a second portion, and a first flexible portion connecting the first portion and the second portion to each other;
   a circuit element that is mounted on the first or second main surface at the first portion; and
   a coil that is connected to a circuit including at least the circuit element,
   wherein
   the substrate is folded along the first flexible portion such that the first main surface is on an outside and the second main surface is on an inside, and the first portion and the second portion face each other, and
   a magnetic layer is disposed on the second main surface at the second portion, and a battery is disposed between the second main surface at the first portion and the magnetic layer.

2. The wireless module according to claim 1, wherein a pattern that is located nearest to the second main surface among patterns that form the coil is formed on the second main surface at the second portion or in a layer near the second main surface.

3. The wireless module according to claim 1, wherein
   the substrate has a multilayer body of insulating layers, and
   a number of the insulating layers at the first portion and the second portion is larger than that at the first flexible portion.

4. The wireless module according claim 1, wherein
   the substrate further includes a third portion and a second flexible portion connecting the third portion to the first portion or the second portion,
   a battery-holding portion that holds the battery is disposed at the third portion, and
   the substrate is folded along the second flexible portion such that the third portion is interposed between the first portion and the second portion.

5. The wireless module according to claim 4, wherein
   the substrate has a multilayer body of insulating layers, and
   a number of the insulating layers at the third portion is larger than that at the first flexible portion and the second flexible portion.

6. The wireless module according to claim 4, wherein the battery-holding portion is disposed on the first main surface and the second main surface at the third portion.

7. The wireless module according to claim 4, wherein
   the substrate further includes a fourth portion and a third flexible portion connecting the fourth portion to the first portion, the second portion, or the third portion,
   the substrate is folded along the third flexible portion such that the fourth portion is located on an opposite side of the first portion from the second portion, and
   the coil is disposed also at the fourth portion.

8. The wireless module according to claim 1, wherein
   the substrate further includes a fourth portion and a third flexible portion connecting the fourth portion to the first portion or the second portion,
   the substrate is folded along the third flexible portion such that the fourth portion is located on an opposite side of the first portion from the second portion, and
   the coil is disposed also at the fourth portion.

9. The wireless module according to claim 1, wherein the circuit element includes a communication antenna or a communication module that includes the communication antenna, and a communication circuit that uses the communication module or the communication antenna as the first portion is formed.

10. The wireless module according to claim 9, wherein the communication antenna does not overlap the battery when viewed in a direction in which the first portion and the second portion are stacked.

11. The wireless module according to claim 1, further comprising:
    a housing that includes a principal part composed of an insulator and that accommodates a multilayer structure that includes the first portion, the second portion, and the battery.

12. A RFID system comprising:
    the wireless module according to claim 1; and
    a wireless tag that includes a coil coupled with the coil of the wireless module and that wirelessly communicates with the wireless module,
    wherein the circuit including the circuit element includes a tag-reading circuit.

13. A wireless power supply device comprising:
    the wireless module according to claim 1; and
    a power transmitter that includes a coil coupled with the coil of the wireless module and that wirelessly supplies power to the wireless module,
    wherein the circuit including the circuit element includes a power reception circuit.

14. The wireless power supply device according to claim 13, wherein the power reception circuit includes a rectifier-smoothing circuit that includes a rectifier element and a capacitor and that rectifies and smoothes an induced voltage of the coil.

15. The wireless power supply device according to claim 14, wherein the battery is a secondary battery that is charged by an output of the rectifier-smoothing circuit.

16. The wireless power supply device according to claim 14, wherein the battery is an electric double layer capacitor that is charged by an output of the rectifier-smoothing circuit.

17. The wireless power supply device according to claim 14, wherein the battery is a polymer electrolytic capacitor that is charged by an output of the rectifier-smoothing circuit.

18. A wireless module comprising:
    a substrate that has a first main surface and a second main surface, and the substrate includes a first portion, a second portion, and a first flexible portion connecting the first portion and the second portion to each other;
    a circuit element that is mounted on the first or second main surface at the first portion; and
    a coil that is connected to a circuit including at least the circuit element,
    wherein
    the substrate is folded along the first flexible portion such that the first main surface is on an outside and the second main surface is on an inside, and the first portion and the second portion face each other, and a dielectric layer is disposed on the second main surface at the second portion, and a battery is disposed between the second main surface at the first portion and the dielectric layer.

19. The wireless module according to claim 18, wherein a pattern that is located nearest to the second main surface among patterns that form the coil is formed on the second main surface at the second portion or in a layer near the second main surface.

20. The wireless module according to claim 18, wherein the substrate has a multilayer body of insulating layers, and a number of the insulating layers at the first portion and the second portion is larger than that at the first flexible portion.

* * * * *